US006622373B1

(12) United States Patent
Tu

(10) Patent No.: US 6,622,373 B1

(45) Date of Patent: Sep. 23, 2003

(54) HIGH EFFICIENCY MONOLITHIC THERMAL INK JET PRINT HEAD

(76) Inventor: Xiang Zheng Tu, 1293 Westwood St., Redwood City, CA (US) 94061

(*) Notice: Subject to any disclaimer, the term of this patent is extended or adjusted under 35 U.S.C. 154(b) by 260 days.

(21) Appl. No.: 09/649,424

(22) Filed: Aug. 28, 2000

(51) Int. Cl.[7] .................................. H01L 21/00

(52) U.S. Cl. .......................... 29/611; 29/890.1; 219/27; 438/21; 347/54

(58) Field of Search ................................ 29/611, 890.1; 438/2.1; 347/20, 47, 54, 55, 68; 216/27, 56

(56) References Cited

U.S. PATENT DOCUMENTS 6,117,698 A * 9/2000 Atobe et al. .................. 216/27
6,306,671 B1 * 10/2001 Silverbrook ................. 216/27

* cited by examiner

*Primary Examiner*—David J. Walczak
*Assistant Examiner*—Peter deVore
(74) *Attorney, Agent, or Firm*—Bruce H. Johnsonbaugh

(57) ABSTRACT

A method for manufacturing a thermal ink jet print head with high efficiency of heat transfer is disclosed. The heating resistors of the head are made of doped single crystalline silicon. Each resistor is disposed in a silicon stripe that is surrounded by a thermal insulating material filled trench and forms a top cover of a corresponding microchannel. The head generated by the resistor can only flow into the ink disposed in the microchannel. The microchannels and nozzles of the head are constructed in a single crystalline silicon substrate. The head is fabricated based on a porous silicon process including: (1) converting heavily doped single crystal silicon into porous silicon; (2) turning porous silicon into oxidized porous silicon; (3) using oxidized porous silicon as a stop barrier for anisotropic etching of single crystal silicon; and (4) selective etching of oxidized porous silicon.

13 Claims, 5 Drawing Sheets

HIGH EFFICIENCY MONOLITHIC THERMAL INK JET PRINT HEAD

BACKGROUND OF THE INVENTION

The present invention relates generally to a thermal ink jet print head and, more particularly, to a thermal ink jet print head fabricated using a less modified standard bipolar processing technique, integrated all device elements in a single silicon substrate, and having a high heat transfer efficiency.

Thermal ink jet print heads available on the market are commonly manufactured using at least two steps: fabricating a nozzle plate and a heating resistor plate separately and then bonding them together. The whole process involves several processing technologies, including semiconductor processing, glass processing, plastic processing and metal plating.

A typical example is a thermal ink jet print head having a nozzle array partially made of nickel. The head is fabricated in two steps. The first step is to form a nozzle plate and a heating resistor plate separately. In order to form the nozzle plate, a photoresist pattern with a plurality of parallel stripes is formed on a stainless steel plate by a photolithographic process. Using the patterned stainless steel plate as a substrate a nickel layer is formed thereon by electrical plating. In order to form the heating resistor plate a silicon substrate is thermally oxidized in wet oxygen to grow an oxide layer thereon. A conductive layer is deposited on the surface of the silicon substrate and patterned to form a heating resistor array by a photolithographic process. The second step is to bond the two plates together by anodic bonding. In this way the trenches in the nickel nozzle plate are covered to form channels and nozzles, and the heating resistors are arranged so that each resistor is disposed in a channel.

In another typical example a plastic plate is used for constructing a thermal ink jet print head. The plastic plate is formed by thermal plastic press process so that its one surface has a plurality of parallel trenches respectively connecting to a square throughout hole therein. The plastic plate is then bonded to an oxide coated silicon substrate having a plurality of thin film heating resistors thereon by applying a resin adhesive.

In these two types of thermal ink jet print heads, there are many problems remaining to be considered. One problem is that the fabrication process involves not only semiconductor processing technology, but also other totally different processing technologies, such as plastic processing technology and metal processing technology. Another problem is that the bonding of two or more plates together requires plate to plate alignment with high accuracy and additional processing equipment. Still another problem is that the mold formation process restricts the size of the thermal ink jet print heads. Because of these problems, the production cost is still relatively high and the performance has been improving very slowly.

In recent years many efforts have been made to develop monolithic thermal ink jet print heads. In one way, a thermal ink jet print head is fabricated based on bulk anisotropic etching. Ethylene-diamine-pyrocatechol-water (EDP) is used as an anisotropic etchant for single crystal silicon. The etch rates in EDP for (100) and (110) planes are much higher than that for (111) plane. The etch rate in EDP for thermal oxidized oxides is three to four orders of magnitude lower than that for (100) and (110) planes. So EDP can be used to undercut a network of highly-boron-doped silicon support ribs and form an array of microchannels. The etch windows of the microchannel are then sealed using thermal oxidation and LPCVD dielectrics. Polysilicon heating resistors are integrated on the top of each microchannel so that when activated, the underlying ink is vaporized and a drop of ink is expelled from the microchannel.

There are still several problems with this monolithic thermal ink jet print head. One problem is lower heat transfer efficiency due to the two facts: (1) the heat generated by the resistors must pass through a dielectric film with low thermal conductivity on its way to the ink; (2) a part of the heat can flow to the silicon walls through the silicon ribs with high thermal conductivity. Another problem is the thermal cross talk between channels due to the heating resistors located on a thin dielectric film and with a short spacing from each other. Still another problem is the uneven ceiling surface of the micro-channels resulting from sealing the etch windows using thermal oxidation and LECVD dielectrics which may hinder the movement of the ink vapor bubbles.

SUMMARY OF THE INVENTION

The present invention is directed to overcome all above-mentioned problems with the multiple-plate structure and the monolithic structure thermal ink jet print heads.

One purpose of the present invention is to provide a thermal ink jet print head having a heating resistor array with each resistor made in a silicon stripe that is surrounded by a thermal isolating material filled trench so that the resistor has a higher lifetime and no cross talk takes place.

Another purpose of the present invention is to provide a thermal ink jet print head having a microchannel array with each microchannel buried under a silicon stripe that has a heating resistor formed therein so that the head generated by the resistor directly flows into the ink disposed in the microchannel.

Still another purpose of the present invention is to provide a thermal ink jet print head having a heating resistor array formed in a silicon epitaxial layer that is commonly used for a standard bipolar integrated circuit fabrication process.

Still another purpose of the present invention is to provide a thermal ink jet print head having a microchannel array totally formed in a silicon substrate.

Still another purpose of the present invention is to provide a thermal ink jet print head with all the device elements and the driving switch circuit integrated in/on a silicon substrate.

Still another purpose of the present invention is to provide a thermal ink jet print head the microstructure of which is fabricated using a porous silicon micromachinig technology that is compatible with the standard TTL or BICMOS fabrication processes.

DETAILED DESCRIPTION OF THE INVENTION

Figure 1:
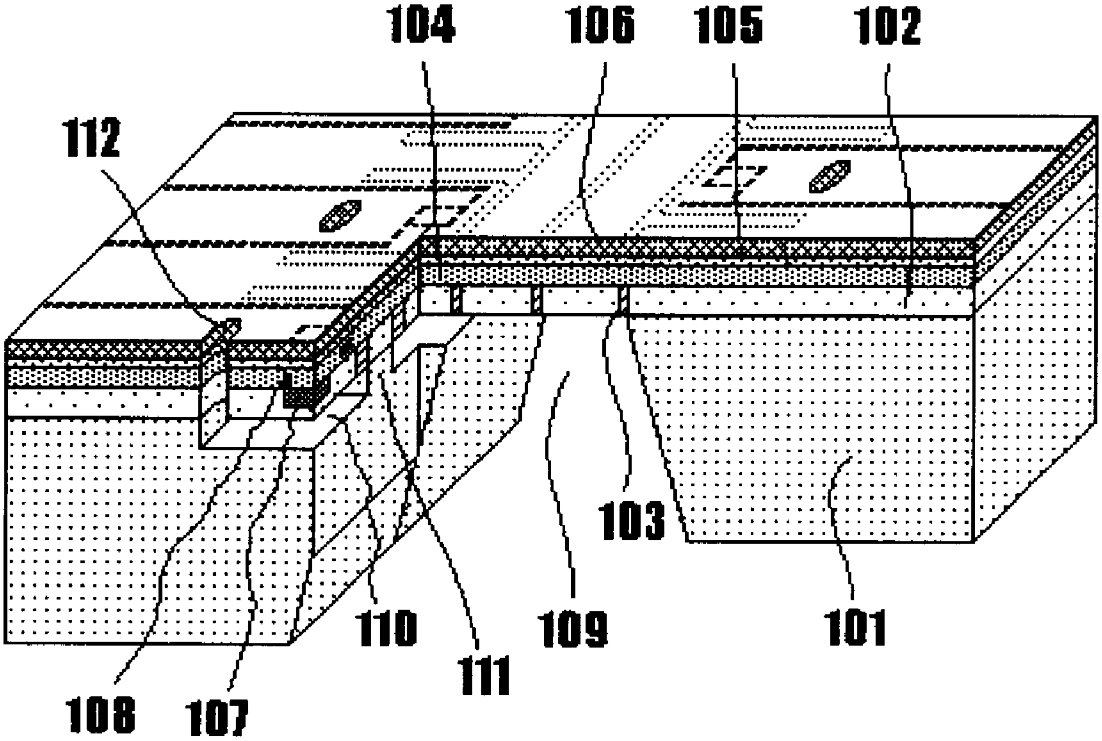
FIG. 1 is a part-cut perspective view of a thermal ink jet print head fabricated in accordance with the present invention.

A thermal ink jet print head provided in accordance with the present invention, as shown in FIG. 1, comprises a single crystalline silicon substrate 101, a silicon epitaxial layer 102 grown on the surface of the silicon substrate 101, a thermal insulating film 104 deposited on the surface of the silicon epitaxial layer 102, an adhesive film 105 applied to the surface of the insulating film 104, a metal film 106 deposited on the surface of the adhesive film 105, a nozzle array 112 recessed into a composite layer consisting of the metal film 106, the adhesive film 105, the insulating film 104, and the silicon epitaxial layer 102, a micro-channel array 110 buried under the silicon epitaxial layer 102 and having each micro-channel connecting to a nozzle, a microchannel wall array 111 having each wall separating two adjacent microchannels, an ink reservoir 109 recessed into the back side of the substrate 101 and communicating with all the microchannels, a heating resistor array 107 having each resistor formed in a stripe cut from the silicon epitaxial layer 102 and positioned above a microchannel, an interconnection network 108 connecting the heating resistors to an outside circuit, and a thermal insulating material filled trench array 103 having each trench surrounding a heating resistor.

The thermal ink jet print head will be mounted on an ink carrier so that the open of the ink reservoir is aligned with the outlet of the ink carrier. When the thermal ink jet print head is in use, the ink flows into the reservoir from the ink carrier and then enters into each microchannel until all the microchannels are filled with the ink. The heating resistors are heated by flowing electrical current to generate Joule heat therein. The generated heat is not allowed to run up to the top of the substrate 101, because there is the thermal insulating film 104 to obstruct the way. The generated heat is also not allowed to run laterally because there is a thermal barrier formed by the thermal insulating trench. The generated heat can only pass through a thin silicon layer with a high thermal conductivity that is positioned below the resistors and then goes into the ink disposed in the microchannel. The ink disposed in the microchannel is heated and further evaporated to form a gas bubble. The gas bubble is getting big and eventually pushes the ink between the gas bubble and the nozzle out of the nozzle.

The fabrication of the thermal ink jet print heads in accordance with the present invention is enabled by porous silicon processing technologies. Porous silicon is a special form of single crystalline silicon with many micron pores or channels formed during anodization of single crystal silicon in HF solution. A value of anodic voltage required to initiate the anodization varies with the doping type and doping concentrations of the single crystal silicon and can be arranged in the order: $V_{p+}<V_{n+}<V_{p-}<V_{n-}$. It can be seen that porous silicon can be selectively formed in heavily doped $p^+$-type or $p^+$-type silicon regions of a lightly doped $p^-$-type or $n^-$-type silicon substrate.

Porous silicon is very chemically active due to its enormous exposed surface area. Oxidation can take place in the whole thickness of a porous silicon layer in an initial short time. This allows the formation of an oxidized porous silicon layer several tens of microns thick in a reduced temperature and a reduced amount of time.

It has been shown that an oxidized porous silicon layer still has a porous structure since the formed oxides are not able to occupy the whole available volume at a reduced temperature. The etch rate in a buffered HF solution of oxidized porous silicon is generally 100 times higher than that expected for standard oxidized single crystal silicon. This provides enoug high selectivity for removing oxidized porous silicon from a silicon substrate coated with oxidized single crystal silicon by etching in a buffered HF solution.

Although oxidized porous silicon has less chemical inertness towards a buffered HF solution, it still has good chemical inertness towards various anisotropic etchants, such as a tetraethyl ammonium hydroxide or $(C_2H_5)_4NOH$ (TMAH). The etch rate in TMAH at 90° C. of (100) silicon is 100 times higher than that expected for oxidized porous silicon. So oxidized porous silicon layer formed in a silicon substrate can be used as a stop layer for anisotropic etching in TMAH.

A fabrication sequence for a thermal ink-jet print head in accordance with the present invention is shown in FIG. 2 to FIG. 13.

Figure 2:
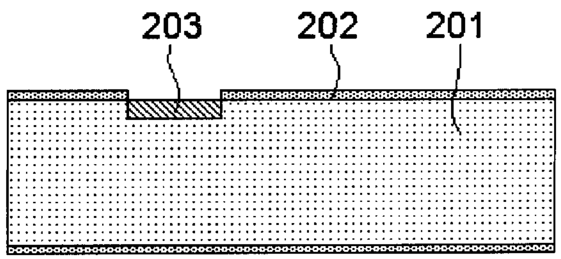
FIG. 2 to FIG. 14 are cross-sectional views of a thermal ink jet print head at each fabrication step in accordance with the present invention.
Figure 3:
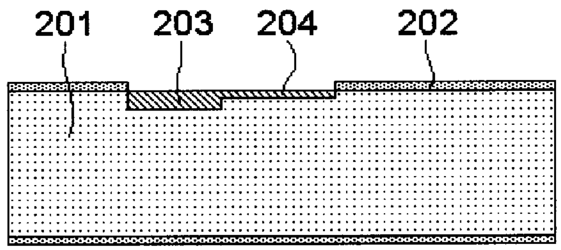

A starting material is a lightly boron doped p-type (100) or (110) single crystalline silicon substrate 201 with a resistively of 10 to 20 Ω-cm. The silicon substrate is thermally oxidized at 1100° C. in wet oxygen to grow a 9000 Å thick oxide film 202 on its surface. A photolithographic process is conducted to define a diffusion window in the oxide layer 202. The diffusion window includes a plurality of parallel stripe with a width of 5 to 10 μm. Using the patterned oxide layer as a diffusion mask a first thermal diffusion process is performed to form a heavily doped $n^+$-type layer in the silicon substrate 201. The diffusion process utilizes a box diffusion technology with antimony (Sb) as a diffusion impurity. A mixture of $Sb_2O_3$ powder and $SiO_2$ powder is used as a diffusion source. The diffusion source is disposed on the bottom of a quartz box and heated at 1220° C. for 20 min in dry nitrogen. Then the silicon substrates 201 are disposed in the box and heated at 1200° C. for 14 h in dry nitrogen containing 0.15–0.4% of oxygen to form a heavily doped $n^+$-type layer 203 in the region restricted by the diffusion window. The formed $n^+$-type layer 203 has a sheet resistance of about 20 Ω/square, and a junction depth of about 10 μm, as shown in FIG. 2. It should be noted that the top view of the resulting $n^+$-type layer 203 is a plurality of parallel diffusion stripes with a width of 5–20 μm and a length of 30–100 μm.

A second photolithographic process is conducted to extend the area occupied by the previous diffusion window in the oxide film 202. The extended area has a rectangular shape connecting with the previous diffusion window. A following thermal diffusion process is done to form another heavily doped $n^+$-type layer 204 in the extended stripe regions of the extended diffusion window in the substrate 201. The thermal diffusion process used is similar to that used for the first thermal diffusion, except a shorter diffusion time needed. The diffusion time is 1 h resulting in a sheet resistance of about 25 Ω/square and a junction depth of about 1.5 μm. It can be seen from FIG. 3 that the newly formed $n^+$-type layer 204 connects with the previous $n^+$-type layer 203. It should be noted that the top view of the resulting $n^+$-type layer 204 is a rectangular in shape.

Figure 4:
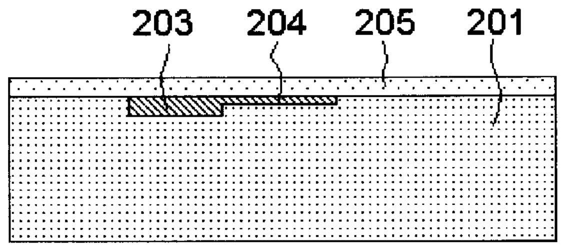

After removing the oxide film 202 by etching in a buffered HF solution, a silicon epitaxial layer 205 is grown on the surface of the silicon substrate 201. At the beginning of the silicon epitaxial process, the silicon substrate is etched in the furnace by flowing HCl to remove about 0.5 μm thick surface layer. Then silicon epitaxial growth proceeds at 1150° C. using $SiCl_4$ as a source gas and $H_2$ as a carrier gas. As a result a silicon epitaxial layer 205 is formed. The epitaxial layer 205 has a thickness of 4.5 μm and a resistivity raging 10–15 Ω-cm, as shown in FIG. 4.

Figure 5:
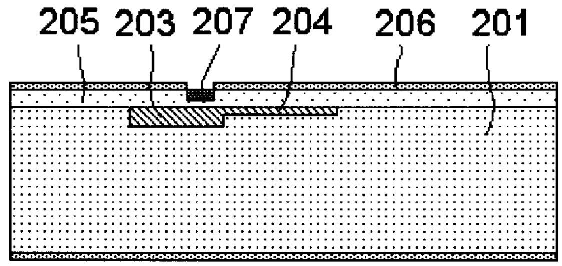

Next a thermal oxidization process is carried out to grow a 5000 Å thick oxide film 206 on the surface of the silicon epitaxial layer 205. After patterning the oxide film 206 by a third photolithographic process, a thermal diffusion process forms a plurality of small rectangular heavily doped $p^+$-type regions 207 in the silicon epitaxial layer 205 so that each small $p^+$-type region is positioned above a diffusion stripe of the $n^+$-type layer 203. The thermal diffusion process is divided into two steps. The first step is to deposit a diffusion source film on the surface of the silicon epitaxial layer 205. The deposition is performed under the conditions: BN plates used as the diffusion source; 950° C. used as the deposition temperature; and the flowing dry nitrogen used as the atmosphere. The second step is to perform the thermal diffusion at 1225° C. in flowing dry nitrogen for 2 h. The resulting $p^+$-type diffusion layer has a sheet resistance of about 10 Ω/square, and a junction depth of about 2 μm, as shown in FIG. 5.

After removing the oxide film 206, a 4000 Å thick low stress silicon rich silicon nitride film 208 is deposited on the surface of the silicon epitaxial layer 205 by low-pressure chemical vapor deposition (LPCVD). The LPCVD is carried out under the conditions: temperature 850° C., gas pressure 150 mTorr, gas source $SiH_2Cl_2$ and $NH_3$ with a flow rate of $SiH_2Cl_2/NH_3$=5.68. The deposited silicon nitride film has a composition of Si/N=0.95, refractive index of n=2.19, and a residual stress of 125 MPa.

Figure 6:
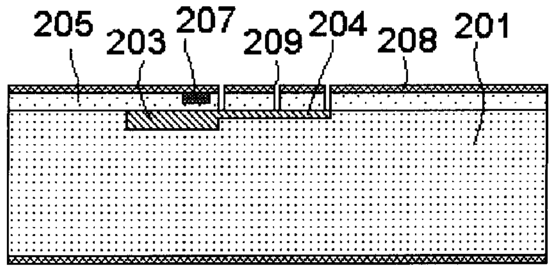
Figure 7:
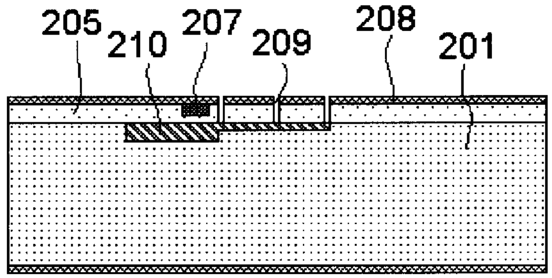
Figure 8:
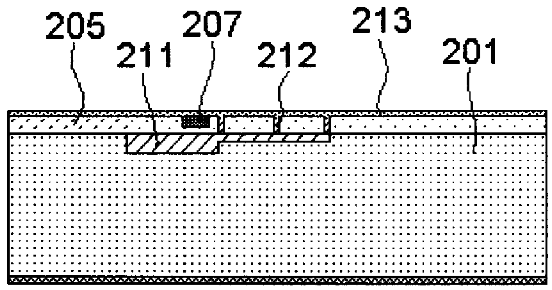

A fourth photolithographic process is conducted to form a photoresist pattern with a plurality of openings therein having a width of 2 to 3 μm. Using the photoresist pattern as a protection mask both the silicon nitride and the epitaxial silicon disposed in the openings are etched away by reactive ion etching (RIE). The RIE etch the silicon nitride under the conditions: etch source gases $SF_6$:He=175:50 sccm; pressure 375 mTorr; RF power 250 W; and RF frequency 13.56 MHz. The RIE etch the epitaxial silicon under the conditions: etch source gases $Cl_2$:He=180:400 sccm; pressure 425 mTorr; RF power 275 W; and RF frequency 13.56 MHz. This fabrication step creates a plurality of trenches 209 that lower down to the interior of the buried $n^+$-type layer 203 and 204, as shown in FIG. 6. Now it is ready for forming porous silicon that is used as a sacrificial material for constructing a microstructure. The anodization process is designed to convert the buried $n^+$-type layer 203 and 204 into porous silicon. The anodization setup has two separated cells with a silicon substrate to be anodized as a separating plate. Each cell is equipped with a platinum plate as an electrode. The two cells are filled with a same HF solution. The anodization reaction takes place in the HF solution disposed in the cell with the negative electrode. The HF solution in the cell with the positive electrode is used as a liquid electrical contact to the backside of the silicon substrate. The HF solution comprises 25% HF, 25% $H_2O$, and 50% pure ethyl. The anodic current is 100 mA/cm$^2$. Under these conditions the buried $p^+$-type layer 203 and 204 convert into a buried porous silicon layer 210 with a porosity of 60% to 70%, as shown in FIG. 7.

With the aim of resistance to a subsequence anisotropic etching, the buried porous silicon layer 210 needs to be turn into a buried oxidized porous silicon layer 211 by a thermal oxidization process. Before doing that a pre-thermal oxidization process is performed at 300° C. in dry oxygen for 1 h. This step is to prevent the pore structure of the porous silicon layer 211 from collapse. Then a high temperature oxidization process is followed at 850° C. in wet oxygen for 1 h to form oxidized porous silicon. At such high temperature the oxidization reaction precedes rapidly so that the whole porous silicon layer turned into 100% oxide layer in only 1 h. It should be noted that in this fabrication step a very thin oxidized single crystal silicon film is also formed on the sidewalls of the trenches 209.

Figure 9:
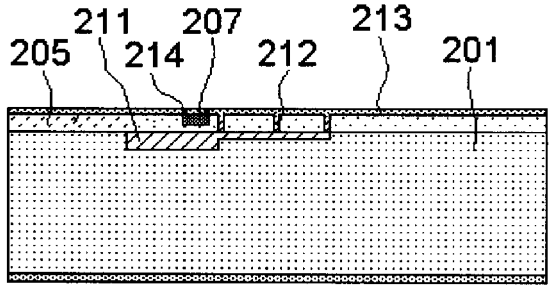

Next a new silicon nitride layer replaces the old silicon nitride film 208. Before removing the old silicon nitride the trenches 209 are sealed up by applying photoresist to prevent the buried oxidized porous silicon layer 211 from etching during. Then the photoresist in the trenches 209 is removed and a 2000 Å thick silicon nitride film is deposited by LPCVD to form a silicon nitride cover 213 on the surface of the silicon epitaxial layer 205 and silicon nitride filled trenches 212 in the trenches 209. After that contact holes are created in the silicon nitride cover 213 by a sixth photolithographic process. It is followed by an aluminum deposition through electron evaporation to form about 1 μm thick aluminum layer. Contact 214, bonding pads, and interconnection are simultaneously formed through a seventh photolithographic process. The contacts 214 are connected to the $p^+$-type region 207, as shown in FIG. 9.

Figure 10:
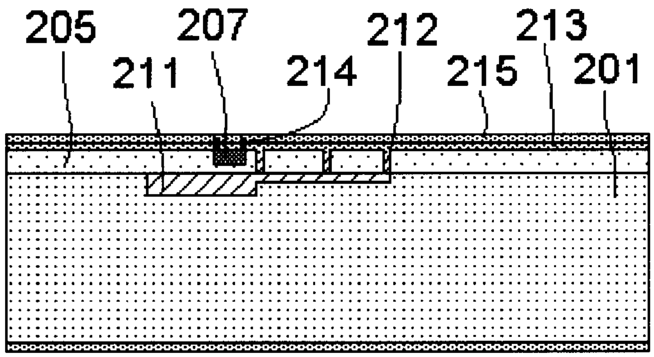

Afterward a 2 μm thick phosphorous glass (PSG) film 215 is deposited by LPCVD. The PSG film 215 covers the whole surface of the substrate 201 and is used as a passivation layer, as shown in FIG. 10. It should be noted that the trenches 209 may not been fully filled up with the silicon nitride deposited at the last deposition step for forming silicon nitride filled trenches 212, because the thickness of the silicon nitride deposited is difficult to reach 2 to 3 μm. But in this fabrication step, the PSG can enter the remained volume and completely fill up the trenches 209.

Figure 11:
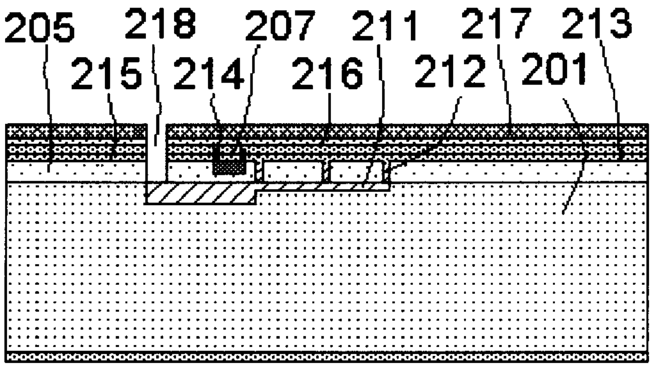

Then a metal composite film consisting of both a 300 Å thick chromium and a 4000 Å thick nickel is laminated on the surface of the passivation layer 215 by electron evaporation. An eighth photolithographic process is followed to form a patterned photoresist film with a plurality of openings therein. Using the patterned photoresist film as a protection mask the composite film disposed in the openings is etched away. An etchant for etching nickel is a mixture of $HNO_3$200 ml, HCl 200 ml, and $H_2O$ 600 ml. An etchant for etching chromium is a mixture of $Ce(SO_4)_2$ 1 g, $HNO_3$ 1 ml, and $H_2O$ 10 ml. Using the patterned composite film as a protection mask the PSG, the silicon nitride, and the epitaxial silicon disposed in the opening are etched away. The etching conditions for PSG are: solution CF4:CHF3:He=90:30:120 sccm, pressure 2.8 mTorr, RF power 450 W, and RF frequency 13.56 MHz. The. etching conditions for the silicon nitride and the epitaxial silicon are similar to that above mentioned. These fabrication steps construct the nozzles 218, as shown in FIG. 11.

Figure 12:
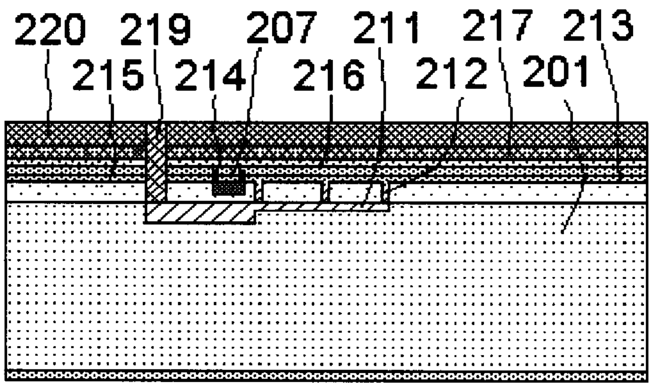

As shown in FIG. 12, after filling up the nozzles with a photoresist, a 4 μm thick nickel film 217 is formed on the surface of the evaporated nickel film 216 by chemical plating. A chemical plating solution consists of $NiCl.6H_2O$ 30 g/l, $NaH_2PO_2.H_2O$ 10 g/l, $NH_4$ Cl 50 g/l, $[(NH_4)$ $2Hc_6H_5O_7]$65 g/l and $(NH_3.H_2O)$ 40–60 ml. The chemical plating is conducted at 95 ° C. with a deposition rate of about 2900 Å/sec.

As an alternate, a 4 μm thick gold film is formed on the surface of the evaporated nickel film 216 by chemical plating.

Figure 13:
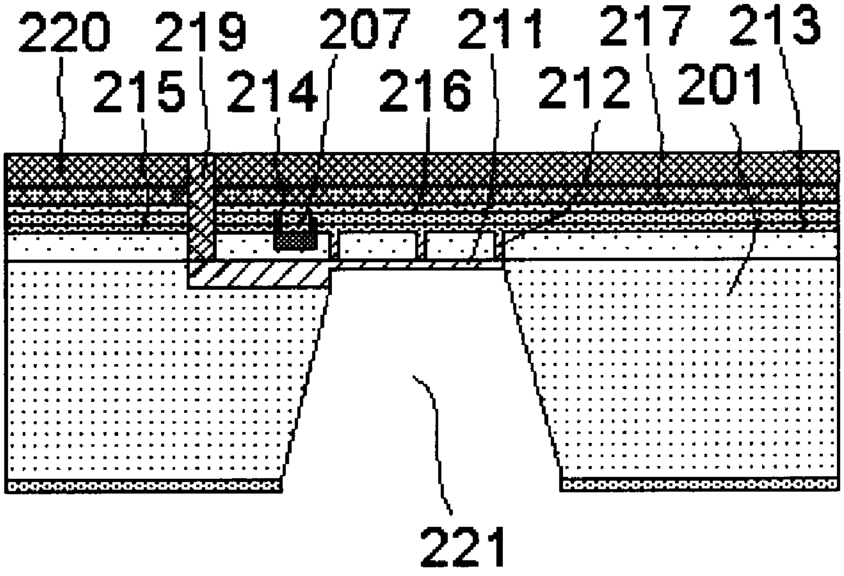

Subsequently an anisotropic etching process is performed. It should be noted that the backside of the silicon substrate already has a PSG film thereon. A ninth photolithographic process creates a plurality of openings in the PSG film on the backside of the silicon substrate 201. Then the silicon substrate 201 is mounted on a holder with the backside exposed. Followed by an anisotropic etching process is conducted. An etching setup is a glass vessel thermostatic with a temperature bath. A reflux condenser is used to keep a constant composition of the etchant during the anisotropic etching process. An etchant used is a 22 wt % TMAH solution. The etch temperature is set at 90° C. and the etch rate for (100) is chosen to be about 1.4 μm/min. The anisotropic etching creates cavities 220 on the backside of the silicon substrate 201, as shown in FIG. 13. Since the etch rate in TMAH of oxidized porous silicon is very low, the anisotropic etching can effectively stop at the oxidized porous silicon layer 211.

Figure 14:
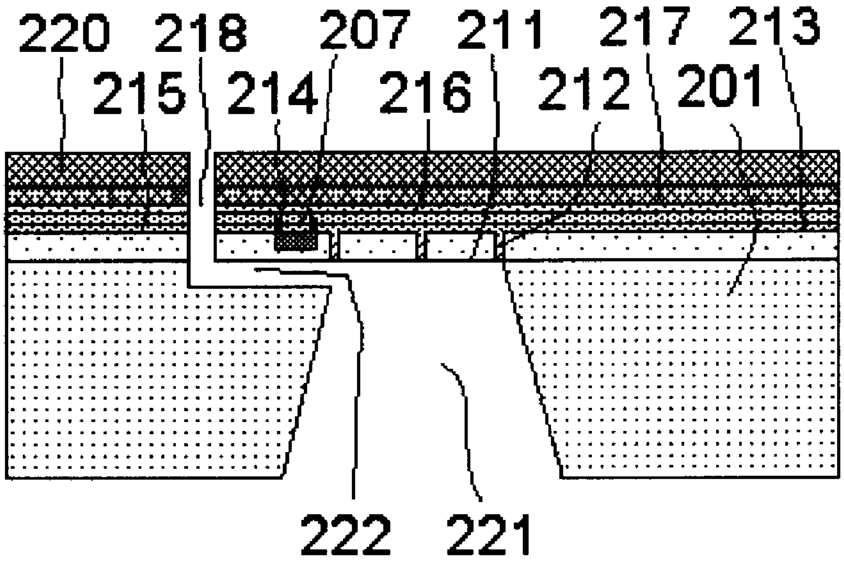

As the final fabrication step for manufacturing thermal ink jet print heads, a plurality of microchannels 222 appears by etching the buried oxidized porous silicon layer 211. The oxidized porous silicon layer 211 is etched away in a solution of BHF: $H_2O$=1:5. The BHF is a mixture of 40% $NH_4F$:HF=1:6. The buffered HF solution does not etch silicon nitride and single crystal silicon. FIG. 14 shows that a resulting microchannel 222 disposes under a resistor 207 and connects to a nozzle 218. FIG. 14 also shows that the silicon epitaxial layer 205 above the cavity 221 is not affected by the final fabrication step and the silicon nitride filled trenches 212 are still retained very well.

A thermal ink jet print head with high efficiency of head transfer and a method for manufacturing the thermal ink jet print head with high efficiency of head transfer in accordance with the present invention have been described. Numerous other changes in the details of construction, arrangement of parts, compositions and materials selection, and processing steps can be carried out without departing from the spirit of the present invention. Only the scope of the following appended claims limits the present invention.

What is claimed is:

1. A method for manufacturing a thermal ink jet print head with each heating resistor formed in a single crystalline silicon stripe that is surrounded by a thermal insulating material filled trench and prearranged to be a part of the top cover of an ink microchannel constructed from single crystalline silicon comprises the steps of:

preparing a lightly doped single crystalline silicon substrate;

forming a heavily doped buried layer shaped to have a rectangular central region and two opposite digital side regions in said silicon substrate;

growing a lightly doped epitaxial layer on the surface of said silicon substrate;

forming a plurality of heating resistors in said epitaxial layer;

depositing a HF resistant etch layer on the surface of said epitaxial layer;

creating a plurality of trenches passing through said HF resistant etch layer and said epitaxial layer and reaching the interior of said buried layer;

performing anodization in HF solution to convert said buried layer into a porous silicon layer;

performing thermal oxidization to convert said porous silicon layer into an oxidized porous silicon layer;

filling up said trenches with a thermal insulating and HF resistant etch material;

forming a plurality of electrodes connecting to said heating resistors;

depositing a passivation layer covering said heating resistors, said electrodes, and said filled up trenches;

depositing a thin metal layer on the surface of said passivation layer;

creating a plurality of recesses passing through said thin metal layer, said passivation layer, said silicon nitride layer and said epitaxial layer;

depositing a thick metal layer on the surface of said thin metal layer;

forming a cavity from the back side of said silicon substrate which utilizes said oxidized porous silicon layer as its bottom; and etching said oxidized porous silicon to form a plurality of microchannels connecting to said cavity.

2. A method for manufacturing a thermal ink jet print head as recited in claim 1, wherein said lightly doped silicon substrate has a resistivity in the range of 0.2 to 20 Ω-cm.

3. A method for manufacturing a thermal ink jet print head as recited in claim 1, wherein said lightly doped silicon substrate has a (100) plane.

4. A method for manufacturing a thermal ink jet print head as recited in claim 1, wherein said lightly doped silicon substrate has a (110) plane.

5. A method for manufacturing a thermal ink jet print head as recited in claim 1, wherein said heavily doped buried layer has a doping concentration in the range of $10^{18}$ to $10^{20}/cm^3$.

6. A method for manufacturing a thermal ink jet print head as recited in claim 1, wherein said lightly doped epitaxial layer has a resistivity in the range of 0.2 to 20 Ω-cm.

7. A method for manufacturing a thermal ink jet print head as recited in claim 1, wherein said HF resistant layer is a silicon nitride layer deposited by low pressure chemical vapor deposition (LPCVD).

8. A method for manufacturing a thermal ink jet print head as recited in claim 1, wherein said HF resistant layer is an amorphous silicon nitride layer (a-SiC) deposited by plasma enhanced chemical vapor deposition (PECVD).

9. A method for manufacturing a thermal ink jet print head as recited in claim 1, wherein said HF resistant layer is an amorphous silicon (a-Si) layer deposited by plasma enhanced chemical vapor deposition (PECVD).

10. A method for manufacturing a thermal ink jet print head as recited in claim 1, wherein said porous silicon having a porosity in the range of 50 to 60%.

11. A method for manufacturing a thermal ink jet print head as recited in claim 1, wherein said oxidized porous silicon formed at a temperature in the range of 750 to 900° C.

12. A method for manufacturing a thermal ink jet print head as recited in claim 1, wherein said heating resistor made of doped single crystalline silicon.

13. A method for manufacturing a thermal ink jet print head as recited in claim 1, wherein said thermal insulating and HF resistant etch material is a silicon nitride layer deposited by low pressure chemical vapor deposition (LPCVD).

* * * * *